(12) United States Patent
Yamashita

(10) Patent No.: US 6,309,259 B1
(45) Date of Patent: Oct. 30, 2001

(54) METAL TERMINAL WITH ELASTIC LOCKING PORTIONS

(75) Inventor: Kazunori Yamashita, Yokkaichi (JP)

(73) Assignee: Sumitomo Wiring Systems, Ltd., Mie (JP)

(*) Notice: Subject to any disclaimer, the term of this patent is extended or adjusted under 35 U.S.C. 154(b) by 0 days.

(21) Appl. No.: 09/610,261

(22) Filed: Jul. 5, 2000

(30) Foreign Application Priority Data

Jul. 12, 1999 (JP) .................................. 11-197698

(51) Int. Cl.[7] ........................ H01R 13/415; H01R 13/05; H01R 13/42
(52) U.S. Cl. ..................... 439/742; 439/825; 439/439; 439/751
(58) Field of Search ................................ 439/742, 866, 439/404, 873, 741, 682, 870, 268, 82, 736, 502, 876, 842, 825, 834

(56) References Cited

U.S. PATENT DOCUMENTS

| | | | |
|---|---|---|---|
| 2,755,453 | * 7/1956 | Cloutier | 439/741 |
| 4,676,579 | * 6/1987 | Ting | 439/825 |
| 4,763,408 | * 8/1988 | Heisey et al. | 29/874 |
| 4,790,764 | * 12/1988 | Kawaguchi | 439/78 |
| 5,078,617 | * 1/1992 | Gutierrez et al. | 439/422 |
| 6,050,842 | * 4/2000 | Ferrill et al. | 439/404 |

FOREIGN PATENT DOCUMENTS

| | | |
|---|---|---|
| 0 899 819 A2 | 3/1999 | (EP) . |
| 0 899 819 A3 | 6/2000 | (EP) . |
| 2 245 770 A | 8/1992 | (GB) . |
| U-63-72863 | 5/1988 | (JP) . |

* cited by examiner

Primary Examiner—Brian Sircus
Assistant Examiner—Chandrika Prasad
(74) Attorney, Agent, or Firm—Oliff & Berridge, PLC

(57) ABSTRACT

A metal terminal is inserted into a contact hole of an electrical circuit substrate and makes electrical contact at the contact hole. The terminal has a stop member that abuts the substrate at a rearward end of the contact hole thereby preventing further insertion of the terminal, and a removal prevention portion that abuts the substrate at a forward end of the contact hole to resist accidental withdrawal of the terminal. The removal prevention portion is resiliently deformable to allow it to pass through the contact hole during insertion of the terminal. Contact elements between the stop member and the removal prevention portion make electrical contact with the contact hole.

6 Claims, 3 Drawing Sheets

METAL TERMINAL WITH ELASTIC LOCKING PORTIONS

BACKGROUND OF THE INVENTION

1. Field of the Invention

The present invention relates to a metal terminal to be installed on an electrical circuit substrate, and to an electrical circuit substrate on which such a terminal is installed.

2. Description of the Related Art

There is disclosed in Laid-Open Japanese Utility Model Application No. 63-72863 a metal terminal to be installed on an electrical circuit substrate. The metal terminal includes an elastic contact part, which is inserted into an installing hole of the circuit substrate and elastically contacts the inner peripheral surface of the installing hole, and a stop portion for preventing insertion of the metal terminal beyond a predetermined insertion position. When the metal terminal has been inserted, it is prevented to some extent from accidentally moving in the withdrawal (pull-out) direction by frictional resistance of the installing hole to the elastic contact part, and it is prevented from accidentally moving further in the insertion direction by the stop portion.

The terminal can be pulled out from the installing hole, for maintenance. However, there is no means for reliably preventing accidental movement of the terminal in the pull-out direction. Thus, it is impossible to completely prevent the accidental movement of the terminal in the insertion or pull-out direction. This can lead to the metal terminal making poor contact with the inner peripheral surface of the installing hole.

U.S. Pat. No. 2,755,453 discloses a metal terminal having a means for securely preventing accidental movement of the terminal in the pull-out direction. The terminal has a stop member for preventing insertion of the terminal beyond a predetermined position and a locking portion for preventing the terminal from being removed from the installing hole. The terminal is locked at one end of the installing hole by plastically deforming the locking portion when the terminal is stopped at the other end by the stop member. In this way pull-out of the terminal can be reliably prevented, and the terminal can be prevented from accidentally moving in either the insertion or the pull-out direction. However, it is difficult to restore the plastically deformed locking portion to its original shape. Thus, the terminal cannot be easily withdrawn for maintenance.

SUMMARY OF THE INVENTION

It is an object of the present invention to provide a metal terminal which affords easy maintenance and is reliably prevented from accidentally moving in a withdrawal direction.

In a first aspect of the invention there is provided a metal terminal for insertion into a contact hole of an electrical circuit substrate and for making electrical contact with the contact hole when the terminal is at a predetermined position in the contact hole. The terminal includes a stop member which abuts the substrate at the rearward end of the contact hole relative to the insertion direction when the terminal is at the predetermined position, thereby preventing further insertion of the terminal. The terminal also includes a removal resistance portion which abuts the substrate at the forward end of the contact hole relative to the insertion direction when the terminal is at the predetermined position, thereby resisting accidental movement of the terminal in the withdrawal direction. The removal resistance portion is resiliently deformable to allow it to pass through the contact hole during insertion of the terminal.

When the metal terminal is inserted into the contact hole, the removal resistance portion abuts the substrate at the end of the contact hole, thus reliably helping to prevent the metal terminal from accidentally moving in the withdrawal direction. However, the removal resistance portion can resiliently deform to allow the metal terminal to pass through the contact hole. Thus, the metal terminal fitting can be withdrawn from the installing hole, e.g. for maintenance.

It is preferable that the removal resistance portion includes a pair of laterally spaced resiliently deformable locking members which are shaped so as to be urged towards each other when the terminal is moved in the withdrawal direction. Because the locking members can be urged towards each other, on withdrawal of the metal terminal from the contact hole, the locking members deform elastically to allow the removal resistance portion to pass through the contact hole.

Preferably the locking members have, at their rear sides with respect to the insertion direction, opposite outer surfaces which are inclined with respect to the insertion direction and mutually taper in the direction opposite to the insertion direction, whereby the locking members, by contact between the outer surfaces and the forward end of the contact hole, urge the terminal in the insertion direction during insertion. This assists insertion of the terminal to the correct position.

It is preferable that the terminal further comprises, between the stop member and the removal resistance portion, a pair of resiliently deformable contact members for bearing resiliently on an inner surface of the contact hole. More preferably the contact members are laterally spaced from each other. Because the resilient contact members bear resiliently on the inner surface of the contact hole, the terminal can be prevented from accidentally moving in a direction sideways relative to the axis of the contact hole.

When the metal terminal has both the locking members and contact members described above, the contact members may connect with the locking members so that the contact members are displaced towards each other when the locking members are urged together.

For example, a gap formed between the locking members may be continuous with a gap formed between the contact members, so that when the locking members deform elastically, the contact members also deform elastically. In this way frictional resistance due to contact member-contact hole interaction can be reduced when the terminal is withdrawn from the contact hole.

In a further aspect, the present invention provides an electrical circuit substrate having a contact hole into which is inserted a metal terminal as described above. Typically the substrate has electrical circuit elements on at least one of its surfaces, and the terminal makes electrical contact with such a circuit element via a conductive layer in the contact hole.

It is preferable that the removal resistance portion of the terminal bears resiliently on an outer face of the substrate at the forward end of the contact hole relative to the terminal insertion direction. Because the removal resistance portion performs its removal resistance function in this manner, it is possible to prevent the terminal from shaking or vibrating in the contact hole.

BRIEF DESCRIPTION OF THE DRAWINGS

Embodiments of the invention will now be described by way of non-limitative example with reference to the accompanying drawings, in which.

DETAILED DESCRIPTION OF THE PREFERRED EMBODIMENTS

Figure 1:
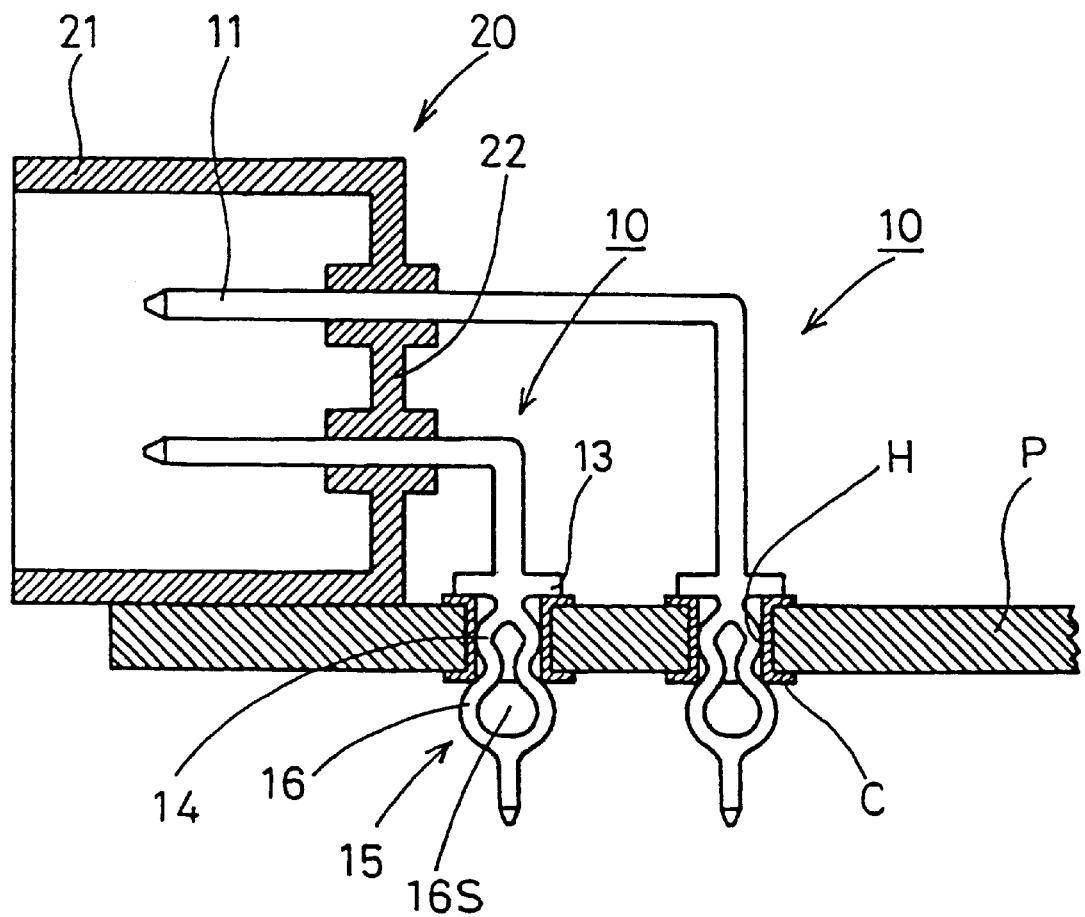
FIG. 1 is a sectional view showing two metal terminals of a first embodiment of the invention, inserted on an electrical circuit substrate.
Figure 2:
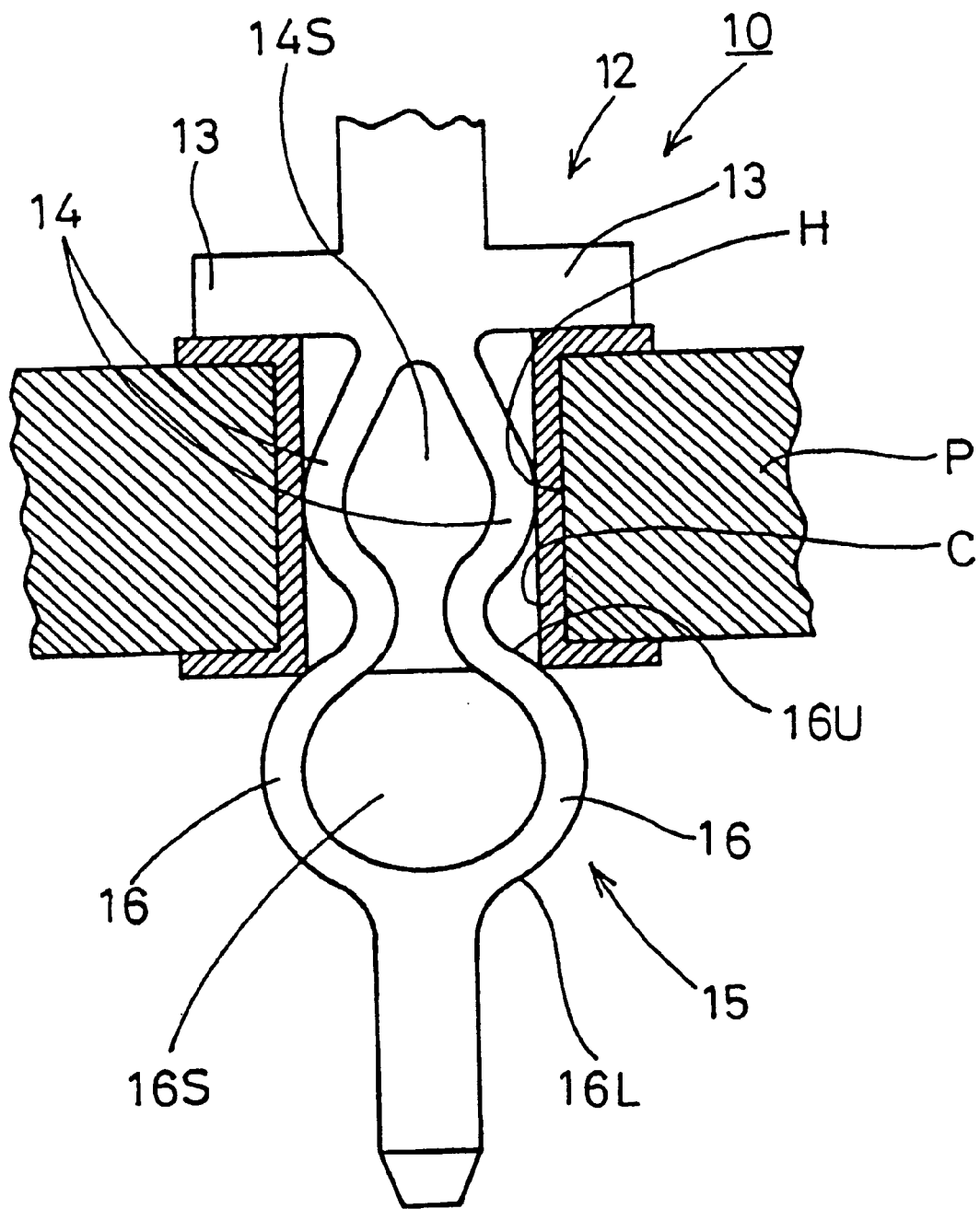
FIG. 2 is an enlarged sectional view showing a part of one of the metal terminals of FIG. 1 that has been inserted into a contact hole.
Figure 3:
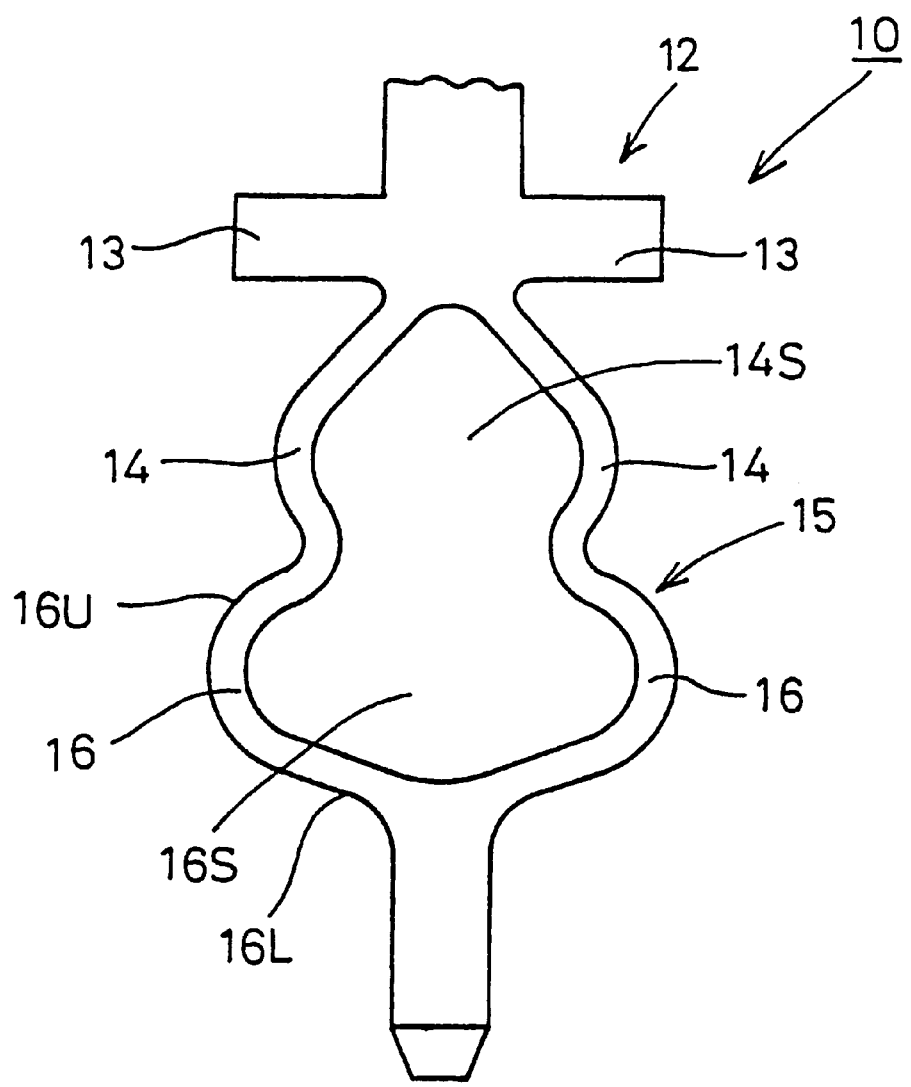
FIG. 3 is an enlarged sectional view showing the part of the metal terminal of FIG. 2 removed from the contact hole.
Figure 3:
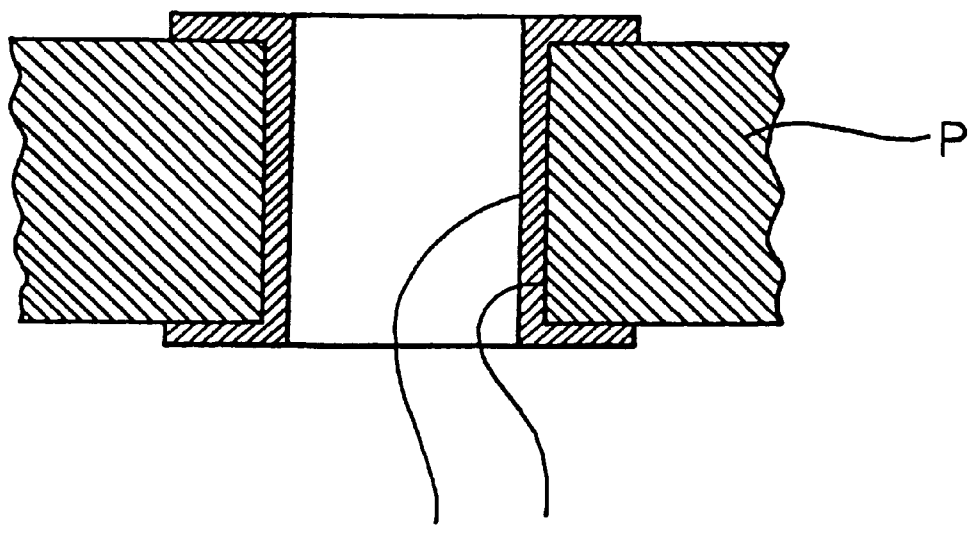

A first embodiment of the present invention will be described below with reference to FIGS. 1 through 3.

Two metal terminals 10 of the first embodiment are installed on an electrical circuit substrate P, and on a connector housing 20. The connector housing 20 is preferably made of synthetic resin material and includes a rectangular hood part 21 open at a forward part (left end in FIG. 1) and a supporting wall part 22 formed so as to close the rear end of the hood part 21. The metal terminals 10 are installed on the connector housing 20 by penetration through the supporting wall part 22.

The circuit substrate P is of electrically insulating material and has a printed circuit (not shown) formed on an upper surface thereof. The circuit substrate P has contact holes H (referred to below as installing holes) which penetrate perpendicularly through the circuit substrate P. The metal terminals 10 are inserted in a downward direction into the respective installing holes H. A contact C is formed by metal-plating the inner peripheral surface of each installing hole H and the peripheral regions adjacent the installing hole H on the upper and lower surfaces of the circuit substrate P. The metal terminals 10 are brought into contact with the respective contacts C. The contacts C are electrically connected to the printed circuit.

Each metal terminal 10 is elongate and is made of an electrically conductive metal material bent in the shape of an L. A tap section 11 of each metal terminal 10 penetrates horizontally through the supporting wall part 22. A substrate connection section 12 of each metal terminal 10 bent vertically downward from the rear end of the tab section 11 is inserted through the installing hole H of the circuit substrate P. The substrate connection section 12 has a pair of stop members (referred to below as stopping portions) 13 projecting horizontally to the left and right, an elastic (i.e. resiliently deformable) contact part located immediately below the stop portions 13, and an elastic removal resistance portion 15 located immediately below the elastic contact part.

Both stopping portions 13 strike the peripheral region of the contact C on the upper surface of the circuit substrate P when the metal terminal 10 is inserted downward into the installing hole H, thus preventing further insertion of the metal terminal. The elastic contact part is forked into two elastic contact portions 14, each extending downwardly from the stopping parts 13 in the form of outwardly convex arcs of approximately part-circular shape. A gap 14S formed between the elastic contact portions 14 allows them to elastically inwardly deform (approach toward each other). In the undeformed state, the maximum distance between the outer surfaces of the elastic contact portions 14 in the transverse widthwise direction (i.e. the direction perpendicular to the direction in which the metal terminal 10 is installed into the installing hole H) is larger than the inner diameter of the installing hole H (see FIG. 3).

The removal resistance portion 15 has a pair of right and left elastic locking portions 16 and a gap 16S formed therebetween. The elastic locking portions 16 are continuous with the respective lower ends of the elastic contact portions 14, and also extend downwardly in the form of outwardly convex arcs of approximately circular shape. The two outwardly convex arcs on each side are joined by an inwardly concave arc at a narrow or waist portion of the connection section 12. That is, the elastic contact portions 14 and the elastic locking portions 16 form a gourd-like shape. The elastic locking portions 16 are elastically inwardly deformable (i.e. they can be urged toward each other), narrowing the gap 16S. The maximum distance between the outer surfaces of the elastic locking portions 16 in the transverse direction in the undeformed state is larger than the maximum distance between the outer surfaces of the elastic contact portions 14 in the undeformed state. When the elastic contact portions 14 are urged towards each other, the elastic locking portions 16 are also elastically inwardly deformed and displaced towards each other. The dimension and shape of the elastic locking portions 16 are such that when the maximum distance between the outer surfaces of the elastic contact portions 14 is equal to the inner diameter of the installing hole H, the maximum distance between the outer surfaces of the elastic locking portions 16 is larger than the inner diameter of the installing hole H.

The operation of the first embodiment will now be described.

To fix the connector housing 20, on which the two metal terminals 10 have been installed, to the upper surface of the circuit substrate P at a predetermined position, the substrate connection sections 12 of the metal terminals 10 are inserted downward into the respective installing holes H.

Firstly, the elastic locking portions 16 contact the periphery of the upper opening of the installing hole H, and are urged together to narrow the gap 16S and enter the installing hole H. A lower-half region 16L of each of the elastic locking portions 16 is curved or inclined. Thus, the elastic locking portions 16 are capable of entering the installing hole H smoothly without being snagged on the opening of the installing hole H. As the elastic locking portions 16 pass through the installing hole H, they eventually reach the lower opening (i.e. the forward end relative to the insertion direction) of the installing hole H, and expand and are restored towards their original shapes. An upper-half region 16U of each of the elastic locking portions 16 is also curved. Thus, the elastic restoring forces of the elastic locking portions 16 accelerate the movement of the metal terminal 10 in the insertion direction when the upper-half regions 16U bear on the periphery of the lower opening.

However, when the stopping parts 13 strike the peripheral region of the contacts C at the upper openings of the installing holes H, further insertion of the metal terminals 10 is prevented. At this time, on the lower surface of the circuit substrate P, the upper-half regions 16U of the elastic locking portions 16 still bear elastically on the periphery of the lower end of the installing hole H. The direction of the elastic restoring force exerted by each of the upper-half regions 16U is oblique to the metal terminal-insertion direction. Therefore, the elastic restoring forces of the elastic locking portions 16 prevent the metal terminal 10 from moving accidentally or vibrating in the installing hole H in both the pull-out direction and the transverse direction. The insertion of the metal terminal 10 into the installing hole H is then completed. It is to be noted that the metal terminal 10 is not required to be soldered to the inner peripheral surface of the installing hole H.

As described above, with the elastic restoration of the elastic locking portions 16, the elastic contact portions 14 now located inside the installing hole H are released laterally outwardly. When the insertion of the metal terminal 10 into the installing hole H is completed, the outer surfaces of the elastic contact portions 14 elastically bear on the contact regions C formed on the inner peripheral surface of the installing holes H. That is, the elastic contact portions 14 and the contact regions C form an electrically conductive contact at a predetermined contact pressure. The stopping parts 13 and the elastic locking portions 16 also form electrically conductive contacts with contact portions C at predetermined contact pressures.

To remove the metal terminal 10 from the installing hole H, the substrate connection section 12 of the metal terminal 10 is pulled out from the installing hole H, with the connector housing 20 being lifted away from the circuit substrate P. During the withdrawal operation, the elastic locking portions 16 are drawn into the installing hole H by elastically deforming the curved upper-half regions 16U to narrow the variable space 16S, the curved upper-half regions 16U making sliding contact with the periphery of the lower opening of the installing hole H. The withdrawal continues until the curved or inclined lower-half regions 16L of the elastic locking portions 16 are restored to their undeformed states, as the lower-half regions 16L make sliding contact with the periphery of the upper openings of the installing holes H. In this way, the metal terminals 10 are removed from the installing holes H.

As described above, in the first embodiment, each metal terminal 10 has the removal resistance portion 15 for preventing accidental movement of the metal terminal 10 inserted into the installing hole H. The removal resistance portions 15 elastically deform from an expanded state for preventing the accidental movement of the metal terminal 10 in the pull-out direction into a narrowed state for allowing the metal terminal 10 to pass through the installing hole H. Therefore, it is possible to allow intentional withdrawal of the metal terminal 10 from the installing hole H, while preventing accidental movement of the metal terminal 10 in the withdrawal direction.

Further, the upper-half regions 16U of the elastic locking portions 16 which contact the periphery of the lower end of the installing hole H are curved or inclined. Thus, by applying a force to the metal terminal 10 in the withdrawal direction, the elastic locking portion 16 can be deformed smoothly without the upper-half region 16U being snagged on the periphery of the lower opening. Accordingly, it is unnecessary to narrow the elastic locking portions 16 with a jig or the like before withdrawal is performed. That is, the shape of the upper-half region 16U allows the metal terminal 10 to be easy to operate.

Further, the elastic contact portions 14 bear elastically on the inner peripheral surface of the installing hole H. Thus, it is possible to prevent accidental movement of the metal terminal 10 in a direction sideways to the axis of the installing hole H.

The gap 16S formed between the elastic locking portions 16 communicates with the gap 14S formed between the elastic contact portions 14. Thus, when the elastic locking portions 16 are urged towards each other, the elastic contact portions 14 also deform elastically and are displaced toward each other, thus separating them from the inner peripheral surface of the installing hole H. Thus, there is no sliding contact friction between the elastic contact portions 14 and the inner peripheral surface of the installing hole H, which reduces the resistance of the metal terminal 10 to withdrawal from the installing hole H.

Furthermore, the removal resistance portion 15 performs a removal resistance function when the elastic locking portions 16 elastically contact the periphery of the lower end of the installing hole H. Therefore, the removal resistance portion 15 can prevent the metal terminal 10 from vibrating in the insertion/pull-out direction in the installing hole H, and from vibrating in a direction transverse to the insertion/pull-out direction.

The present invention is not limited to the above-described embodiment. For example, the following embodiments are included in the scope of the present invention:

(1) In the first embodiment, the removal resistance portion is composed of a pair of elastic locking portions. But according to the present invention, the removal resistance portion may be composed of a one-piece elastic locking portion.

(2) In the first embodiment, the metal terminal has an elastic contact part that bears elastically on the inner peripheral surface of the installing hole H. But according to the present invention, the metal terminal may have a construction with no elastic contact part. In this case, the stopping part or the removal resistance portion contacts the circuit substrate.

(3) In the first embodiment, the gap formed between the pair of elastic locking portions communicates with the gap formed between the pair of elastic contact portions. Within the present invention, these two gaps may be independent of each other.

(4) In the first embodiment, the removal resistance portion bears elastically on the periphery of an end of the installing hole H in the insertion/pull-out direction. Within the present invention, the removal resistance portion may be locked to the periphery of the opening of the installing hole H unelastically, namely, in an unstressed state.

(5) In the first embodiment, the removal resistance portion exerts an elastic restoring force on the periphery of an opening of the installing hole H in the transverse direction to the insertion/pull-out direction. Within the present invention, the removal resistance may be so constructed that it does not exert such a force.

Although the invention has been described above in relation to particular embodiments, many variations are possible within the spirit and scope of the invention herein described, as will be clear to an expert.

What is claimed is:

1. A metal terminal for insertion into a contact hole of an electrical circuit substrate and for making electrical contact at the contact hole when the terminal is at a predetermined position therein, the terminal comprising:

a stop member which, when the terminal is at said predetermined position, abuts the substrate at a rearward end of the contact hole relative to an insertion direction, thereby preventing further insertion of the terminal;

a removal resistance portion which, when the terminal is at said predetermined position, abuts the substrate at a forward end of the contact hole relative to the insertion direction, thereby resisting accidental movement of the terminal in a withdrawal direction, the removal resistance portion being resiliently deformable to allow it to pass through the contact hole during insertion and withdrawal of the terminal, said removal resistance portion comprising a pair of laterally spaced resiliently deformable locking members that are urged towards each other when the terminal is moved in the withdrawal direction; and a pair of laterally spaced resiliently deformable contact members that bears resiliently on an inner surface of the contact hole when the terminal is at said predetermined position, said pair of contact members being located between said stop member and said removal resistance portion and connected with the locking members so that the contact members are displaced towards each other when the locking members are urged towards each other.

2. A metal terminal according to claim 1, wherein said locking members have, at their rear sides with respect to the insertion direction, outer surfaces which are inclined with respect to the insertion direction and mutually taper in a direction opposite to the insertion direction, whereby said locking members, by contact between said outer surfaces and said forward end of the contact hole, urge the terminal in the insertion direction during insertion.

3. An electrical circuit substrate having at least one contact hole and a metal terminal located in said contact hole at a predetermined position therein, having been inserted by movement in an insertion direction into said contact hole, said terminal comprising:

a stop member that abuts said substrate at a rearward end of said contact hole relative to said insertion direction, thereby preventing further insertion of said terminal;

a removal resistance portion that abuts the substrate at a forward end of said contact hole relative to said insertion direction, thereby resisting accidental movement of said terminal in a withdrawal direction opposite to said insertion direction, said removal resistance portion being resiliently deformable to allow it to pass through said contact hole during insertion and withdrawal of said terminal, said removal resistance portion comprising a pair of laterally spaced resiliently deformable locking members that are urged towards each other when said terminal is moved in said withdrawal direction; and a pair of laterally spaced resiliently deformable contact members that bears resiliently on an inner wall surface of said contact hole, said pair of contact members being located between said stop member and said removal resistance portion and connected with said locking members so that said contact members are displaced towards each other when said locking members are urged towards each other.

4. An electrical circuit substrate according to claim 3, wherein the removal resistance portion of the terminal bears resiliently on an outer face of the substrate at a forward end of the contact hole relative to the terminal insertion direction.

5. An electrical circuit substrate according to claim 3, wherein said locking members have, at their rear sides with respect to the insertion direction, outer surfaces which are inclined with respect to the insertion direction and mutually taper in a direction opposite to the insertion direction, whereby said locking members, by contact between said outer surfaces and said forward end of the contact hole, urge the terminal in the insertion direction during insertion.

6. An electrical connector including at least one metal terminal, each metal terminal comprising:

a stop member which, when the terminal is at said predetermined position, abuts the substrate at a rearward end of the contact hole relative to an insertion direction, thereby preventing further insertion of the terminal;

a removal resistance portion which, when the terminal is at said predetermined position, abuts the substrate at a forward end of the contact hole relative to the insertion direction, thereby resisting accidental movement of the terminal in a withdrawal direction, the removal resistance portion being resiliently deformable to allow it to pass through the contact hole during insertion and withdrawal of the terminal, said removal resistance portion comprising a pair of laterally spaced resiliently deformable locking members that are urged towards each other when the terminal is moved in the withdrawal direction; and a pair of laterally spaced resiliently deformable contact members that bears resiliently on an inner surface of the contact hole when the terminal is at said predetermined position, said pair of contact members being located between said stop member and said removal resistance portion and connected with the locking members so that the contact members are displaced towards each other when the locking members are urged towards each other.

* * * * *